US012702037B2

(12) United States Patent
Seyama

(10) Patent No.: US 12,702,037 B2
(45) Date of Patent: Aug. 4, 2026

(54) BONDING APPARATUS, BONDING METHOD, AND COMPUTER READABLE STORAGE MEDIUM

(71) Applicant: Yamaha Robotics Co., Ltd., Tokyo (JP)

(72) Inventor: Kohei Seyama, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 510 days.

(21) Appl. No.: 18/039,275

(22) PCT Filed: Jan. 18, 2021

(86) PCT No.: PCT/JP2021/001397
§ 371 (c)(1),
(2) Date: May 29, 2023

(87) PCT Pub. No.: WO2022/153519
PCT Pub. Date: Jul. 21, 2022

(65) Prior Publication Data
US 2024/0304592 A1     Sep. 12, 2024

(51) Int. Cl.
*H10W 72/00*          (2026.01)
(52) U.S. Cl.
CPC ...... *H10W 72/0711* (2026.01); *H10W 72/075* (2026.01); *H10W 72/07178* (2026.01); *H10W 72/07183* (2026.01); *H10W 72/07531* (2026.01)
(58) Field of Classification Search
CPC ........................................................ H01L 24/78
See application file for complete search history.

(56) References Cited

U.S. PATENT DOCUMENTS 6,555,401 B2    4/2003  Koduri
6,789,240 B2    9/2004  Koduri
(Continued)

FOREIGN PATENT DOCUMENTS

CN      106575627      4/2017
JP      2000260806     9/2000
(Continued)

OTHER PUBLICATIONS

"International Search Report (Form PCT/ISA/210) of PCT/JP2021/001397", mailed on Apr. 20, 2021, with English translation thereof, pp. 1-4.
(Continued)

*Primary Examiner* — Yu-Hsi D Sun
(74) *Attorney, Agent, or Firm* — JCIPRNET

(57)          ABSTRACT
A bonding apparatus includes a bonding tool, first and second imaging units, a calculation part, and a drive control part. The first and second imaging units each include an optical system and an imaging element arranged to satisfy a Scheimpflug condition such that a plane parallel to a stage surface becomes a focal plane. The calculation part calculates three-dimensional coordinates of a target point to which a bonding wire is to be supplied next among bonding points, based on a first picture which is a picture of the target point captured in a first image outputted by the first imaging unit, and a second picture which is a picture of the target point captured in a second image outputted by the second imaging unit. The drive control part causes the bonding tool to approach the target point based on the three-dimensional coordinates of the target point.

6 Claims, 7 Drawing Sheets

(56) References Cited

U.S. PATENT DOCUMENTS

| | | | |
|---|---|---|---|
| 9,911,666 | B2 | 3/2018 | Chin et al. |
| 10,262,968 | B2 | 4/2019 | Hayata et al. |
| 10,586,781 | B2 * | 3/2020 | Hayata .................... H01L 24/85 |

FOREIGN PATENT DOCUMENTS

| | | | | | |
|---|---|---|---|---|---|
| JP | 2000260806 | A | * | 9/2000 | ............. H01L 24/78 |
| JP | 2002158255 | | | 5/2002 | |
| JP | 2002158255 | A | * | 5/2002 | ............. H01L 24/85 |
| JP | 2016025304 | | | 2/2016 | |
| JP | 2016025304 | A | * | 2/2016 | |
| KR | 20170015488 | | | 2/2017 | |
| NO | 2015069191 | | | 5/2015 | |
| SG | 2013084975 | | | 6/2015 | |
| SG | 11201610377 | R | | 1/2017 | |
| SG | 11201710074 | T | | 1/2018 | |
| TW | 201522910 | | | 6/2015 | |
| WO | 2016158588 | | | 10/2016 | |

OTHER PUBLICATIONS

"Office Action of Taiwan Counterpart Application", issued on Mar. 6, 2023, with partial English translation thereof, pp. 1-13.
"Office Action of Korea Counterpart Application", issued on Jul. 22, 2024, with English translation thereof, p. 1-p. 21.

* cited by examiner

BONDING APPARATUS, BONDING METHOD, AND COMPUTER READABLE STORAGE MEDIUM

CROSS-REFERENCE TO RELATED APPLICATION

This application is a 371 application of the International PCT application serial no. PCT/JP2021/001397, filed on Jan. 18, 2021. The entirety of each of the above-mentioned patent application is hereby incorporated by reference herein and made a part of this specification.

TECHNICAL FIELD

The present invention relates to a bonding apparatus, a bonding method, and a computer readable storage medium.

RELATED ART

In a conventional wire bonder, a work area is imaged by a camera from directly above to confirm the position thereof, and the camera is retracted and a bonding tool is moved to directly above the work area to then perform a bonding process. Thus, since an offset is present in the arrangement of the camera and the bonding tool, a technique for correctly measuring their relative positions is sometimes used (see Patent Document 1, for example).

RELATED ART DOCUMENTS

Patent Documents

Patent Document 1: International Publication No. 2016/158588

SUMMARY OF INVENTION

Problems to be Solved by Invention

In the case of sequentially performing position confirmation and the bonding process, it not only takes time, but deviation may also occur in the measured position due to the influence of heat or the like between the position confirmation and the bonding process. In addition, upon mounting of an imaging unit to a structure other than a head part, factors causing measurement errors increase. On the other hand, if a conventional imaging unit is arranged on the tool side of the head part, it would be difficult to observe the work area due to its narrow field of view.

The present invention has been made to solve such problems and provides a bonding apparatus and the like capable of realizing accurate three-dimensional coordinate measurement of a work area with respect to a head part and shortening a lead time from three-dimensional coordinate measurement of the work area to execution of a bonding process.

Means for Solving Problems

A bonding apparatus according to a first aspect of the present invention includes a bonding tool, a first imaging unit and a second imaging unit, a calculation part, and a drive control part. The bonding tool supplies a bonding wire to bonding points of a substrate mounted on a stage. The first imaging unit and the second imaging unit each include an optical system and an imaging element arranged to satisfy a Scheimpflug condition such that a plane parallel to a stage surface of the stage becomes a focal plane. The calculation part calculates three-dimensional coordinates of a target point to which the bonding wire is to be supplied next among the bonding points, based on a first picture which is a picture of the target point captured in a first image outputted by the first imaging unit, and a second picture which is a picture of the target point captured in a second image outputted by the second imaging unit. The drive control part causes the bonding tool to approach the target point based on the three-dimensional coordinates of the target point calculated by the calculation part.

A bonding method according to a second aspect of the present invention includes steps below. In an imaging step, each of a first imaging unit and a second imaging unit is caused to image a target point to which a bonding wire is to be supplied next among bonding points of a substrate mounted on a stage. The first imaging unit and the second imaging unit each include an optical system and an imaging element arranged to satisfy a Scheimpflug condition such that a plane parallel to a stage surface of the stage becomes a focal plane. In a calculation step, three-dimensional coordinates of the target point are calculated based on a first picture which is a picture of the target point captured in a first image outputted by the first imaging unit, and a second picture which is a picture of the target point captured in a second image outputted by the second imaging unit. In a driving step, a bonding tool which supplies the bonding wire is caused to approach the target point based on the three-dimensional coordinates of the target point.

A bonding program according to a third aspect of the present invention causes a computer to execute steps below. In an imaging step, each of a first imaging unit and a second imaging unit is caused to image a target point to which a bonding wire is to be supplied next among bonding points of a substrate mounted on a stage. The first imaging unit and the second imaging unit each include an optical system and an imaging element arranged to satisfy a Scheimpflug condition such that a plane parallel to a stage surface of the stage becomes a focal plane. In a calculation step, three-dimensional coordinates of the target point are calculated based on a first picture which is a picture of the target point captured in a first image outputted by the first imaging unit, and a second picture which is a picture of the target point captured in a second image outputted by the second imaging unit. In a driving step, a bonding tool which supplies the bonding wire is caused to approach the target point based on the three-dimensional coordinates of the target point.

Effect of Invention

The present invention provides a bonding apparatus and the like capable of realizing accurate three-dimensional coordinate measurement of a work area with respect to a head part and shortening a lead time from three-dimensional coordinate measurement of the work area to execution of a bonding process.

DESCRIPTION OF EMBODIMENTS

Hereinafter, the present invention will be described based on embodiments of the invention, but the invention according to the scope of claims is not limited to the following embodiments. Moreover, not all the configurations described in the embodiments are essential as the means for solving the problems.

Figure 1:
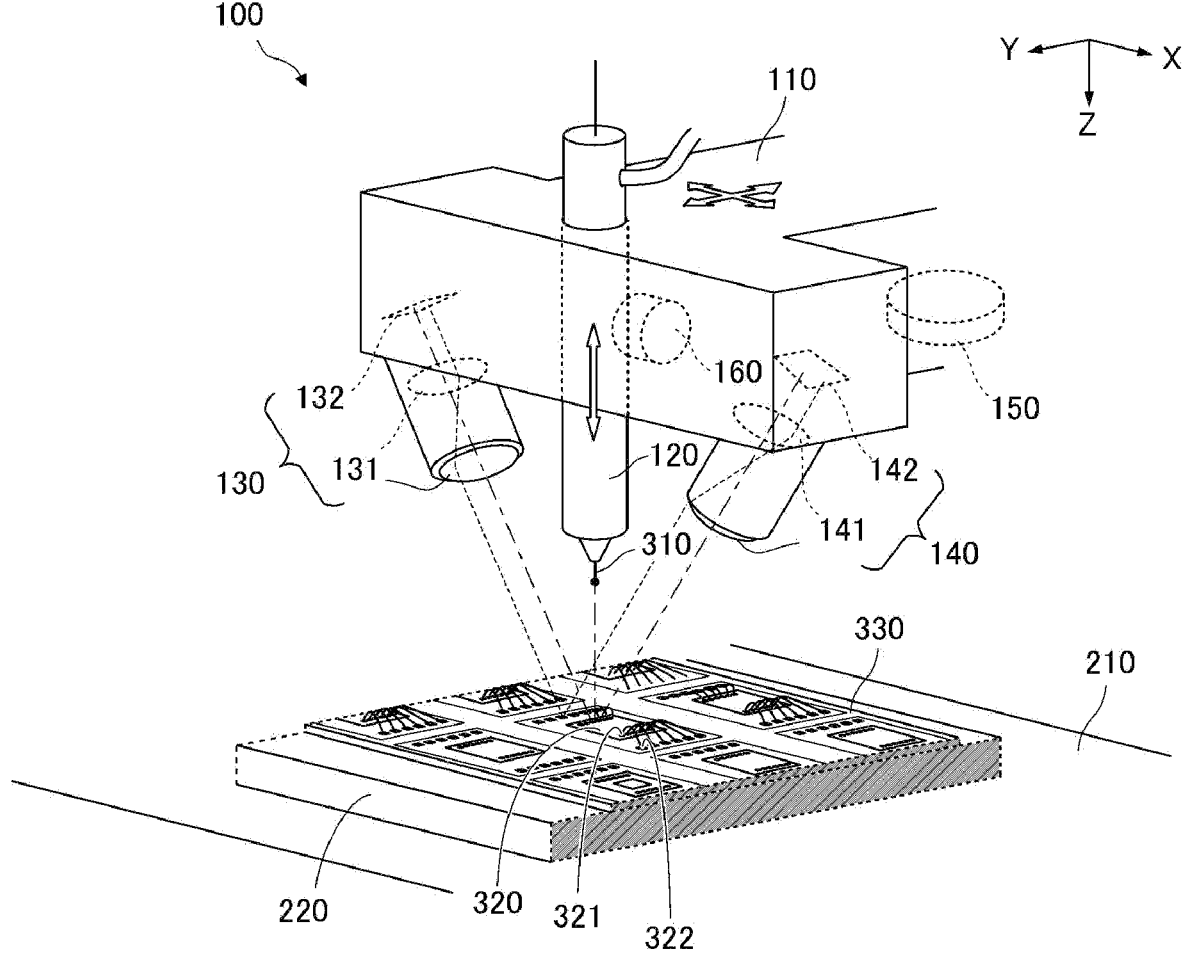
FIG. 1 is a perspective view schematically showing main parts of a wire bonder according to this embodiment.

FIG. 1 is a perspective view schematically showing main parts of a wire bonder 100 according to this embodiment. The wire bonder 100 is a bonding apparatus that connects a pad electrode 321 of a semiconductor chip 320 and a lead electrode 322 of a substrate 330 by a wire 310 which is a bonding wire. The pad electrode 321 and the lead electrode 322 are targets for which three-dimensional coordinates are measured to supply the wire 310, and may be referred to as bonding points or the like in the following description.

The wire bonder 100 mainly includes a head part 110, a bonding tool 120, a first imaging unit 130, and a second imaging unit 140. The head part 110 supports the bonding tool 120, the first imaging unit 130, and the second imaging unit 140, and is movable in a plane direction by a head drive motor 150. As shown in the figure, the plane direction is a horizontal direction defined by an X-axis direction and a Y-axis direction, and is also a moving direction of a stage 220 mounted on a pedestal 210. The substrate 330 is mounted and fixed on the stage 220.

The bonding tool 120 serves to supply the wire 310, e.g., a gold wire, and includes a wire clamper, a transducer, and a capillary. This embodiment will be described below based on ball bonding using a capillary, but wedge bonding using a wedge tool may also be adopted. At the time of a first bonding to the pad electrode 321, the wire 310 is extended from a tip as shown in the figure, and in the case of this embodiment adopting ball bonding, a free air ball (FAB) is formed at the tip of the wire 310 by a torch electrode (not shown). The bonding tool 120 is movable in a height direction with respect to the head part 110 by a tool drive motor 160. As shown in the figure, the height direction is a Z-axis direction perpendicular to the plane direction.

The first imaging unit 130 is an imaging unit for imaging a bonding point positioned below the bonding tool 120, and includes a first optical system 131 and a first imaging element 132. The first imaging unit 130 is obliquely provided at the head part 110 with its optical axis directed toward below the bonding tool 120 (details will be described later). The first optical system 131 and the first imaging element 132 are arranged to satisfy the Scheimpflug condition such that a plane parallel to a stage surface of the stage 220 becomes a focal plane.

The second imaging unit 140 is an imaging unit for imaging a bonding point positioned below the bonding tool 120, and includes a second optical system 141 and a second imaging element 142. The second imaging unit 140 is obliquely provided at the head part 110 on a side opposite to the first imaging unit 130 with respect to the bonding tool 120, with its optical axis directed toward below the bonding tool 120 (details will be described later). The second optical system 141 and the second imaging element 142 are arranged to satisfy the Scheimpflug condition such that a plane parallel to the stage surface of the stage 220 becomes a focal plane.

The XYZ coordinate system is a spatial coordinate system taking a reference position of the head part 110 as the origin. The wire bonder 100 images a bonding point by the first imaging unit 130 and the second imaging unit 140, and calculates three-dimensional coordinates of the bonding point based on these images. Specifically, three-dimensional coordinates $(X_{RTA}, Y_{RTA}, Z_{RTA})$ of the pad electrode 321, which is a first bonding point, and three-dimensional coordinates $(X_{RTB}, Y_{RTB}, Z_{RTB})$ of the lead electrode 322, which is a second bonding point, are calculated. The wire bonder 100 takes the three-dimensional coordinates $(X_{RTA}, Y_{RTA}, Z_{RTA})$ of the pad electrode 321 and the three-dimensional coordinates $(X_{RTB}, Y_{RTB}, Z_{RTB})$ of the lead electrode 322 as approach targets to drive the head part 110 and the bonding tool 120. For position adjustment in the plane direction, the stage 220 may be driven, or the head part 110 and the stage 220 may be cooperatively driven together.

Figure 2:
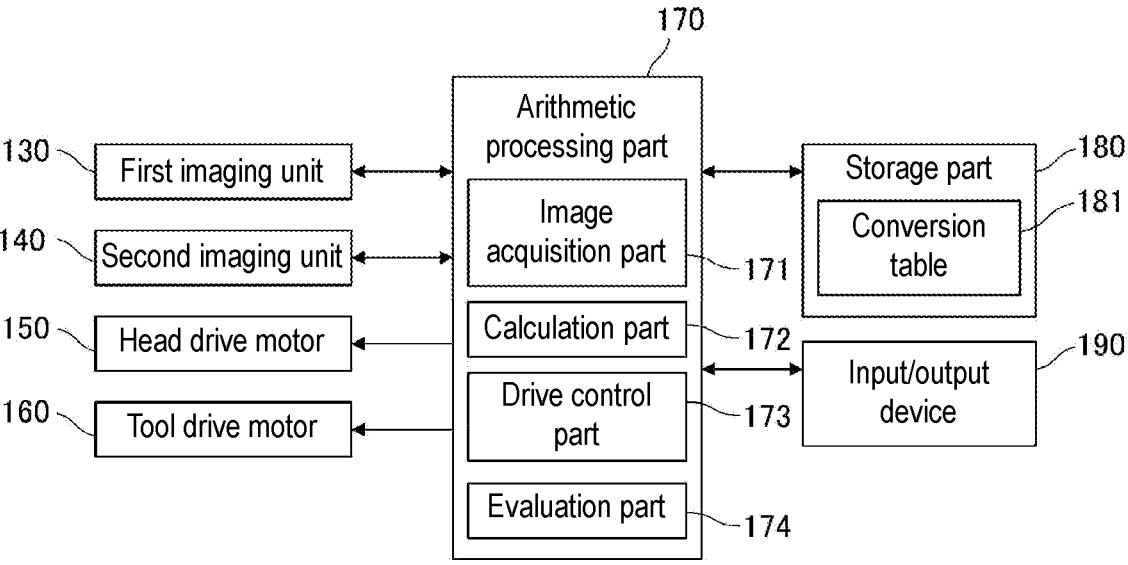
FIG. 2 is a system configuration view of the wire bonder.

FIG. 2 is a system configuration view of the wire bonder 100. A control system of the wire bonder 100 is mainly composed of an arithmetic processing part 170, a storage part 180, an input/output device 190, a first imaging unit 130, a second imaging unit 140, a head drive motor 150, and a tool drive motor 160. The arithmetic processing part 170 is a processor (central processing unit (CPU)) that controls the wire bonder 100 and executes programs. The processor may also be a configuration that cooperates with an arithmetic processing chip such as an application specific integrated circuit (ASIC) or a graphics processing unit (GPU). The arithmetic processing part 170 reads out a bonding program stored in the storage part 180 and executes various processes related to bonding.

The storage part 180 is a nonvolatile storage medium and is configured by, for example, a hard disk drive (HDD). In addition to programs for executing control and processing of the wire bonder 100, the storage part 180 may further store various parameter values, functions, lookup tables, etc. used for performing control and arithmetic operations. The storage part 180 particularly stores a conversion table 181. The conversion table 181 is a lookup table that converts coordinate values of a first picture and a second picture into three-dimensional coordinates of the bonding point upon input of the coordinate values (details will be described later). Herein, the first picture is a picture of the bonding point captured in a first image outputted by the first imaging unit 130, and the second picture is a picture of the bonding point captured in a second image outputted by the second imaging unit 140.

The input/output device 190 includes, for example, a keyboard, a mouse, and a display monitor, and is a device that receives menu operations of a user and prompts information to the user. For example, the arithmetic processing part 170 may display the first image and the second image side by side on the display monitor, which is one of the input/output devices 190.

The first imaging unit 130 receives an imaging request signal from the arithmetic processing part 170 and executes imaging, and transmits the first image outputted by the first imaging element 132 as an image signal to the arithmetic processing part 170. Similarly, the second imaging unit 140 receives an imaging request signal from the arithmetic processing part 170 and executes imaging, and transmits the second image outputted by the second imaging element 142 as an image signal to the arithmetic processing part 170.

The head drive motor 150 receives a drive signal from the arithmetic processing part 170 and moves the head part 110 in the XY directions. The tool drive motor 160 receives a drive signal from the arithmetic processing part 170 and moves the bonding tool 120 in the Z direction.

The arithmetic processing part 170 also serves as a functional arithmetic part that executes various arithmetic operations according to the processes instructed by the bonding program. The arithmetic processing part 170 may function as an image acquisition part 171, a calculation part 172, a drive control part 173, and an evaluation part 174.

The image acquisition part 171 transmits imaging request signals to the first imaging unit 130 and the second imaging unit 140, and acquires an image signal of the first image and an image signal of the second image.

The calculation part 172 calculates three-dimensional coordinates of the bonding point based on a first picture which is a picture of the bonding point captured in the first image, and a second picture which is a picture of the bonding point captured in the second image. Specifically, the three-dimensional coordinates are obtained using the conversion table 181. The drive control part 173 generates a drive signal for driving the head drive motor 150 and a drive signal for driving the tool drive motor 160, and transmits the drive signals to the respective motors. For example, upon calculation of the three-dimensional coordinates $(X_{RT4}, Y_{RT4}, Z_{RT4})$ of the pad electrode 321 by the calculation part 172, a drive signal for bringing the bonding tool 120 closer to $(X_{RT4}, Y_{RT4}, Z_{RT4})$ is generated and transmitted to the tool drive motor 160. In the case of moving the stage 220 in the horizontal direction, a drive signal is transmitted to a stage drive motor that moves the stage 220. The evaluation part 174 evaluates adequacy of the bonding process based on the image outputted by at least one of the first imaging unit 130 and the second imaging unit 140.

Figure 3:
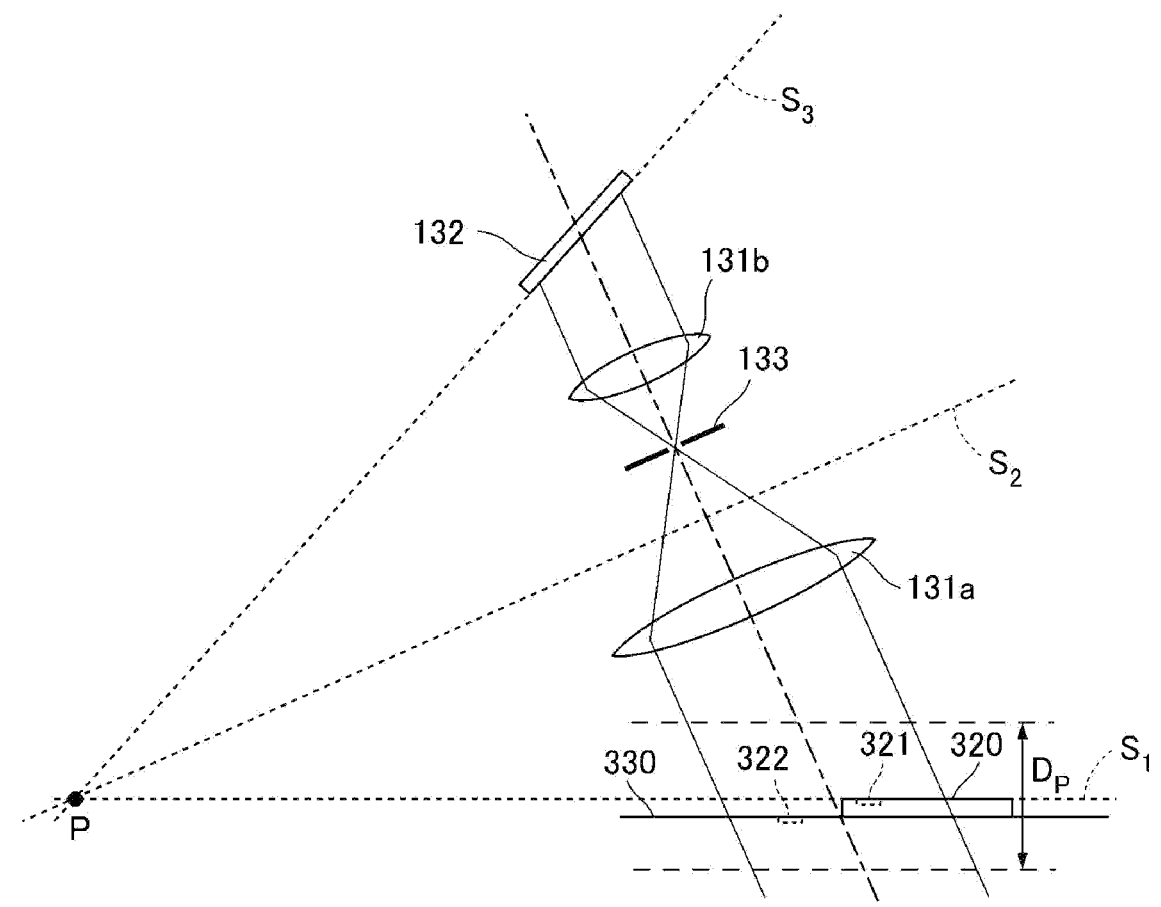
FIG. 3 is a view for illustrating a Scheimpflug optical system.
Figure 3:
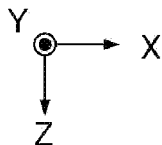

FIG. 3 is a view for illustrating a Scheimpflug optical system adopted in the first imaging unit 130. A similar Scheimpflug optical system is also adopted in the second imaging unit 140, but herein the Scheimpflug optical system of the first imaging unit 130 will be described as a representative example.

In FIG. 3, a plane $S_1$ is an expected focal plane parallel to the stage surface of the stage 220 and including a surface of the semiconductor chip 320 on which the pad electrode 321 is provided. A virtual plane $S_2$ is a plane including a principal plane of the first optical system 131, which includes an object-side lens group 131*a* and an image-side lens group 131*b* as constituent groups. A plane $S_3$ is a plane including a light receiving surface of the first imaging element 132. In this embodiment, the Scheimpflug optical system includes the first optical system 131 and the first imaging element 132 which are arranged to satisfy the Scheimpflug condition. The arrangement satisfying the Scheimpflug condition refers to an arrangement in which the plane $S_1$, the virtual plane $S_2$, and the plane $S_3$ intersect each other on a common straight line P.

To illustrate the Scheimpflug condition in an easy-to-understand manner, FIG. 3 shows the object-side lens group 131*a* and the semiconductor chip 320 close together, but they are actually separated from each other as shown in FIG. 1. The bonding tool 120 is capable of moving in the Z-axis direction without interfering with the first imaging unit 130 in a space above the semiconductor chip 320.

A diaphragm 133 is arranged between the object-side lens group 131*a* and the image-side lens group 131*b* and restricts the passing light. A depth of field $D_P$ may be adjusted by the diameter of the diaphragm 133. Thus, as long as the lead electrode 322 on the substrate 330 is within the field of view of the first imaging unit 130 together with the pad electrode 321 on the semiconductor chip 320, the first imaging unit 130 can image the lead electrode 322 and the pad electrode 321 in one image in a focused state. In addition to the electrodes, for example, when the tip of the wire 310 extending from the bonding tool 120 approaches within the depth of field $D_P$, the first imaging unit 130 can image both the tip of the wire 310 and the pad electrode 321 in a focused state.

The second imaging unit 140 has a similar configuration as the first imaging unit 130 and is arranged at the head part 110 symmetrically with respect to the YZ plane including a central axis of the bonding tool 120. Thus, similar to the first imaging unit 130, as long as the pad electrode 321 and the lead electrode 322 are within the field of view of the second imaging unit 140, the second imaging unit 140 can image the pad electrode 321 and the lead electrode 322 in one image in a focused state.

In this embodiment, bilateral telecentricity is realized by the object-side lens group 131*a* and the image-side lens group 131*b*. Accordingly, since an image of the observation target can be formed on the imaging element at a constant magnification, it is convenient for calculation of the three-dimensional coordinates. Particularly, in the Scheimpflug optical system, it is desirable that an observation target present on the straight line P side and an observation target present on a side far from the straight line P are object-side telecentric with the same magnification on the image formation plane.

Figure 4:
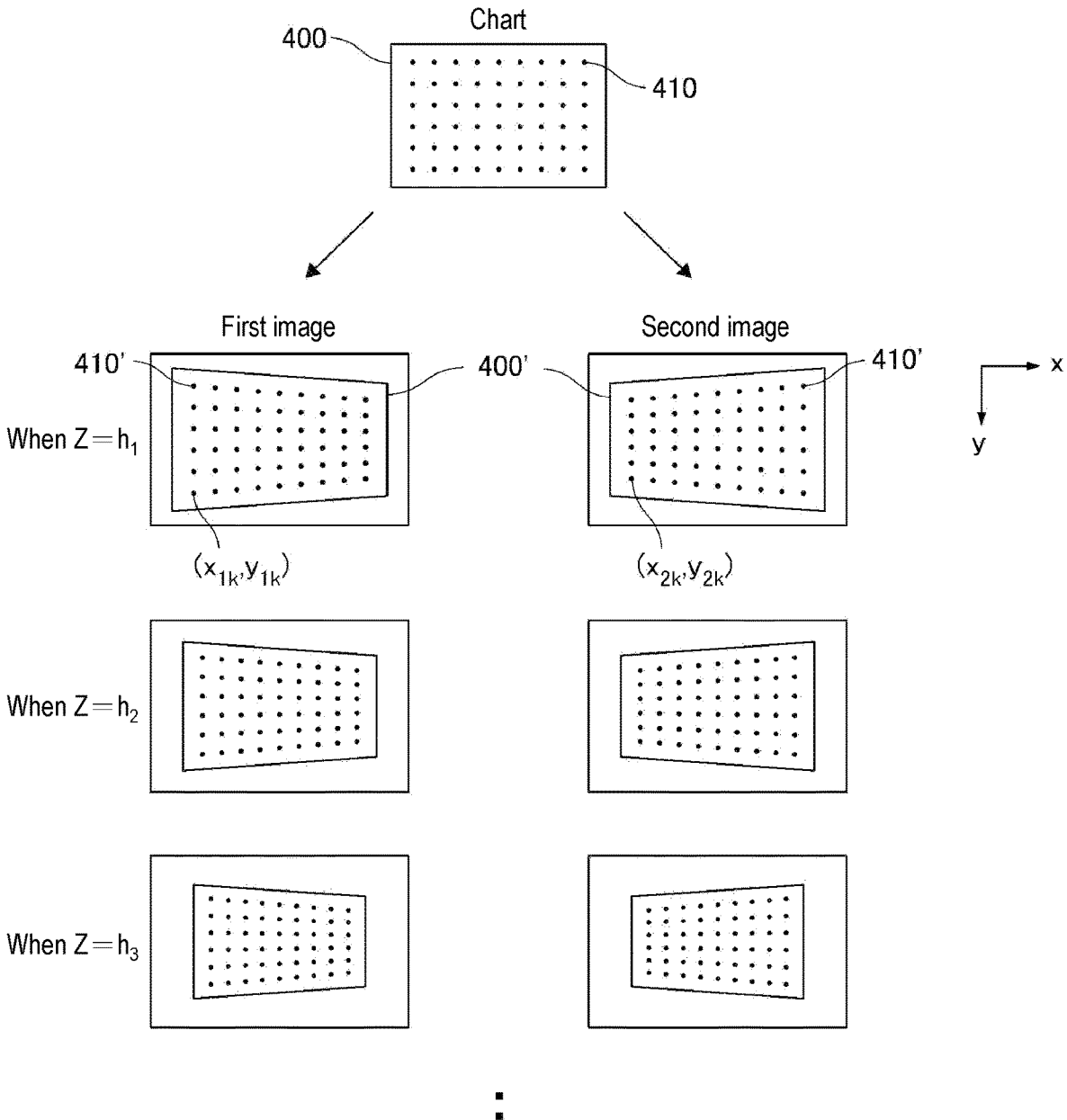
FIG. 4 is a view for illustrating a calculation principle of three-dimensional coordinates.

FIG. 4 is a view for illustrating a calculation principle of three-dimensional coordinates of the bonding point. In particular, FIG. 4 is a view illustrating a procedure for generating the conversion table 181. The conversion table 181 is generated using a first image of the first imaging unit 130 and a second image of the second imaging unit 140 captured by mounting a chart 400, which has a thickness of stacking the semiconductor chip 320 on the substrate 330, onto the stage 220 immediately below the bonding tool 120.

A plurality of dots 410 are printed at a set pitch in a matrix pattern on the surface of the chart 400. The height of the head part 110 is adjusted to $Z=h_1, h_2, h_3 \ldots$, and imaging is performed on this chart 400 at the respective heights to acquire pairs of the first image and the second image.

Since the first imaging unit 130 and the second imaging unit 140 adopt a Scheimpflug optical system, obtained chart pictures 400' are respectively distorted into trapezoids oriented in opposite directions while the entire surface is in a focused state. Taking the horizontal axis as the x-axis and the vertical axis as the y-axis of the image coordinate system, coordinates of dot pictures 410' corresponding to each other in the first image and the second image are calculated as $(x_{1k}, y_{1k})$ and $(x_{2k}, y_{2k})$.

Regarding each dot 410 of the chart 400, since coordinates $(X_k, Y_k)$ on the stage 220 are known and the height $h_k=Z_K$ is adjusted at the time of imaging, three-dimensional coordinates $(X_k, Y_k, Z_K)$ of each dot 410 are determined at the time of imaging. Then, since the coordinates $(x_{1k}, y_{1k})$ and $(x_{2k}, y_{2k})$ of each dot picture 410' of the first image and the second image captured at the height $h_k$ are calculated, it is possible to acquire a coordinate correspondence between each dot 410 and the dot pictures 410', which are pictures of the dot 410. That is, for each height at which imaging is performed, it is possible to discretely acquire the correspondence between the three-dimensional coordinates $(X_k, Y_k,$ $Z_K$) and the two-dimensional coordinates ($x_{1k}$, $y_{1k}$) and ($x_{2k}$, $y_{2k}$). Such correspondences are described in the conversion table 181.

The conversion table 181 described and generated in this manner is a collection of data indicating the correspondence between the three-dimensional coordinates ($X_k$, $Y_k$, $Z_K$) and the two-dimensional coordinates ($x_{1k}$, $y_{1k}$) and ($x_{2k}$, $y_{2k}$) and may be used as a lookup table. That is, referring to the conversion table 181, it is possible to convert coordinate values ($x_{1R}$, $y_{1R}$) of the first picture and coordinate values ($x_{2R}$, $y_{2R}$) of the second picture into three-dimensional coordinates ($X_R$, $Y_R$, $Z_R$) of the bonding point. In the case where the combination of ($x_{1R}$, $y_{1R}$) and ($x_{2R}$, $y_{2R}$) as calculated is not present in the conversion table 181, an interpolation process may be performed using neighboring coordinates present in the conversion table 181.

Further, in addition to the conversion table 181 in the form of a lookup table, other methods may also be used to convert the coordinate values ($x_{1R}$, $y_{1R}$) of the first picture and the coordinate values ($x_{2R}$, $y_{2R}$) of the second picture into the three-dimensional coordinates ($X_R$, $Y_R$, $Z_R$) of the bonding point. For example, a polynomial approximation function may be obtained based on the correspondence between the three-dimensional coordinates ($X_k$, $Y_k$, $Z_K$) and the two-dimensional coordinates ($x_{1k}$, $y_{1k}$) and ($x_{2k}$, $y_{2k}$) obtained in advance using the chart 400, and conversion may be performed from ($x_{1R}$, $y_{1R}$) and ($x_{2R}$, $y_{2R}$) to ($X_R$, $Y_R$, $Z_R$) accordingly. Thus, in the case of using a lookup table or a polynomial approximation function generated based on actual measurement data, since error factors resulting from constituent elements such as lens aberration and mounting errors of imaging units are absorbed in the actual measurement data, it is expected that three-dimensional coordinates can be calculated with higher accuracy.

On the other hand, a conversion formula may also be obtained arithmetically using the Scheimpflug geometric condition, a baseline length defined between two imaging elements, etc., without depending on the actual measurement data. For example, a conversion matrix that takes physical quantities such as a tilt angle of the optical system or the imaging element as a parameter and converts a trapezoidal image into a rectangular image is defined, and trapezoidal correction is performed on the first image and the second image according to this conversion matrix. Then, taking the two images subjected to the trapezoidal correction as stereo images, the three-dimensional coordinates of the observation target are calculated based on an amount of positional deviation between the images. According to this method, it is convenient in that acquisition of actual measurement data using a chart or the like in advance can be omitted.

Figure 5:
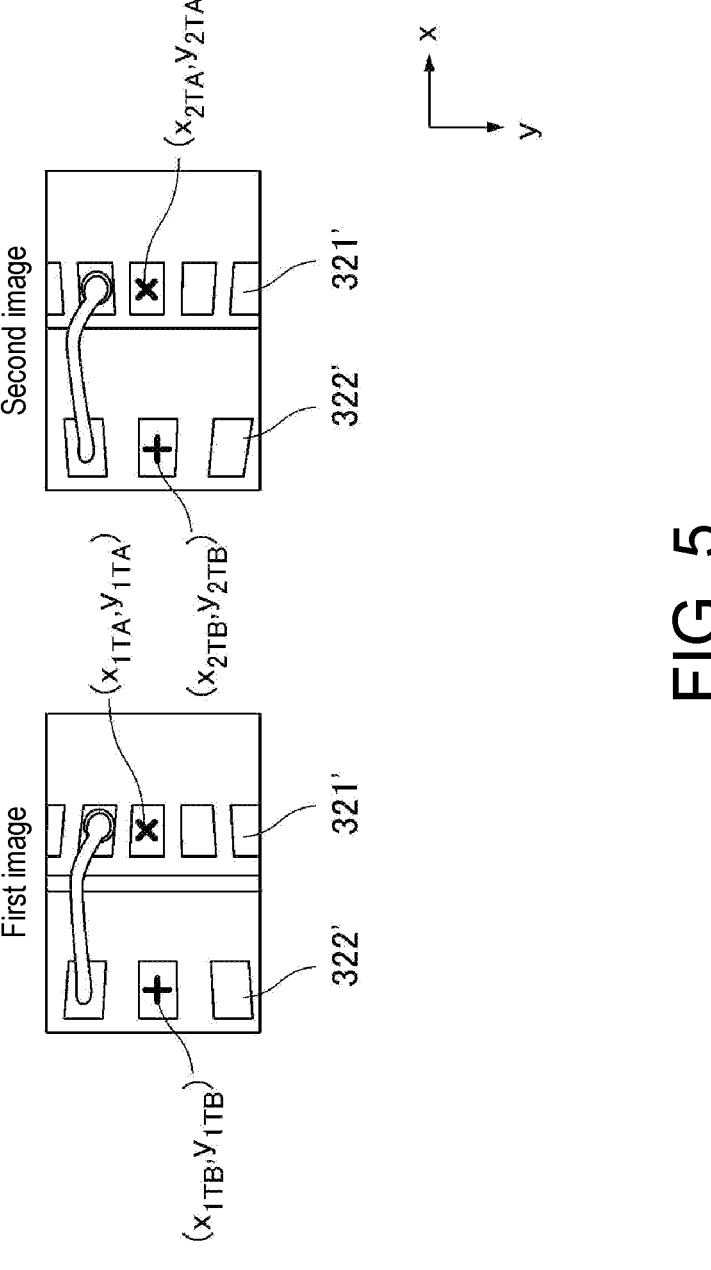
FIG. 5 is a view for illustrating three-dimensional coordinate measurement of a bonding point.

Next, measurement of the three-dimensional coordinates of the bonding point during the bonding process will be described. FIG. 5 is a view for illustrating three-dimensional coordinate measurement of a bonding point. Specifically, FIG. 5 is a view schematically showing examples of a first image and a second image acquired from the first imaging unit 130 and the second imaging unit 140 in a situation where a first bonding is about to be performed on a specific pad electrode 321.

A plurality of pad electrode pictures 321', which are pictures of the pad electrodes 321, and a plurality of lead electrode pictures 322', which are pictures of the lead electrodes 322, are captured in the first image and the second image. The pad electrode 321 on which the first bonding is about to be performed is a target point to which the bonding tool 120 is brought closer to supply the wire 310, and a pad electrode picture 321' that is the picture of this pad electrode 321 is indicated by a "x" mark. For example, taking a point of intersection of two diagonal lines of this pad electrode picture 321' as the coordinate values to be calculated, the calculation part 172 calculates ($x_{1TA}$, $y_{1TA}$) from the first image and ($x_{2TA}$, $y_{2TA}$) from the second image. The calculation part 172 inputs the pair of coordinate values to the conversion table 181 to calculate the three-dimensional coordinates ($X_{RTA}$, $Y_{RTA}$, $Z_{RTA}$) of the target point.

A lead electrode 322 on which a second bonding is performed following the first bonding is a subsequent point to which the bonding tool 120 draws a loop from the target point to supply the wire 310, and a lead electrode picture 322' that is the picture of this lead electrode 322 is indicated by a "+" mark. For example, taking a point of intersection of two diagonal lines of this lead electrode picture 322' as the coordinate values to be calculate, the calculation part 172 calculates ($x_{1TB}$, $y_{1TB}$) from the first image and ($x_{2TB}$, $y_{2TB}$) from the second image. The calculation part 172 inputs the pair of coordinate values to the conversion table 181 to calculate the three-dimensional coordinates ($X_{RTB}$, $Y_{RTB}$, $Z_{RTB}$) of the subsequent point.

In the bonding process, if the respective three-dimensional coordinates of the pad electrode 321 and the lead electrode 322 that are about to be connected in one loop are calculated collectively from one set of the first image and the second image, the three-dimensional coordinates are not only calculated accurately, but processing time is also shortened. Further, since it is not required to temporarily stop the bonding tool 120 to perform imaging between the first bonding and the second bonding, smooth movement of the bonding tool 120 can also be realized. This embodiment adopts the method of collectively calculating the respective three-dimensional coordinates of one set of the pad electrode 321 and the lead electrode 322 that are about to be connected in one loop, but the imaging process may also be executed separately to perform calculation individually. Further, it is also possible to take, as targets, all the pad electrode pictures 321' and the lead electrode pictures 322' captured in the first image and the second image obtained in one imaging process to collectively calculate the three-dimensional coordinates of the respective pad electrodes 321 and lead electrodes 322 in advance.

Figure 6:
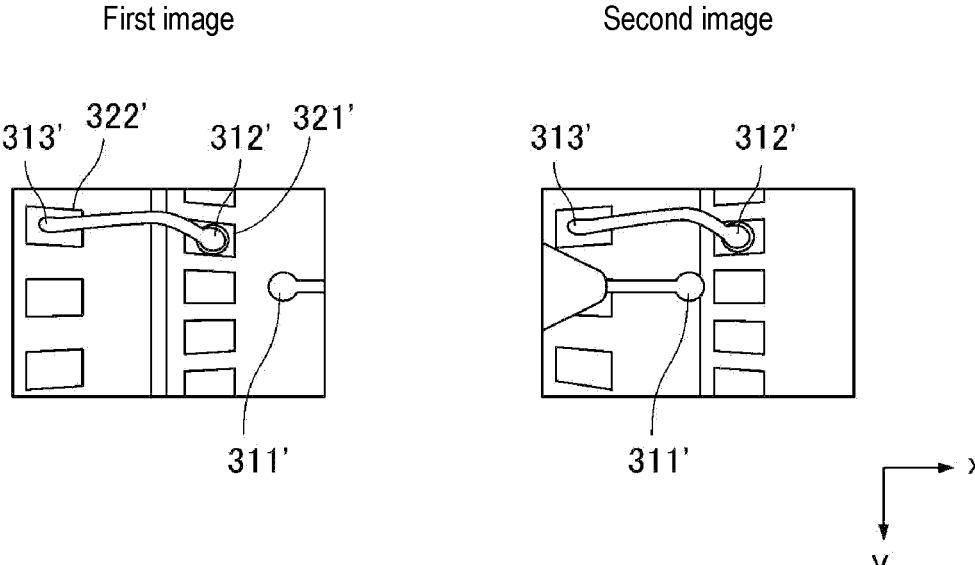
FIG. 6 is a view for illustrating an adequacy evaluation of a bonding process.

The first image and the second image acquired from the first imaging unit 130 and the second imaging unit 140 are not limited to the case of being used for calculating three-dimensional coordinates, but may also be used, for example, to evaluate adequacy of the bonding process. FIG. 6 is a view for illustrating an adequacy evaluation of the bonding process. Specifically, FIG. 6 a view schematically showing an example of a first image and a second image captured at a timing at which the bonding tool 120 is lowered at high speed toward the pad electrode 321 that is the target of the first bonding and is switched to low-speed lowering immediately before the FAB contacts the pad electrode 321.

As described above, the first optical system 131 of the first imaging unit 130 and the second optical system 141 of the second imaging unit 140 each have a constant depth of field. Thus, a FAB picture 311', which is a picture of the FAB approaching the pad electrode 321, and a pad joint end picture 312' and a lead joint end picture 313', which are pictures of the joint end of the wire 310 that has already been connected, can be captured in one image in a focused state.

Thus, the evaluation part 174 evaluates the adequacy of the bonding process using such images. Specifically, a first adequacy evaluation evaluates the FAB picture 311', which is a picture of the FAB generated at the tip of the wire 310 before contacting the pad electrode 321, which is the first bonding point. For example, by extracting a contour of the FAB picture 311', it is evaluated whether the FAB diameter with respect to the width of the wire 310 falls within a specified ratio. Further, by binarizing the FAB picture 311', it is evaluated whether impurities adhere to the surface.

The evaluation part 174 determines whether to use either the first image or the second image or both the first image and the second image depending on the evaluation item. For example, in the case of evaluating whether impurities adhere to the surface, since the FAB picture 311' of the first image and the FAB picture 311' of the second image are images of the surface observed from directions opposite to each other, both images are used to respectively perform evaluation. In the case where the evaluation part 174 evaluates the observed FAB as good, the drive control part 173 performs the first bonding directly. On the other hand, in the case where the evaluation part 174 evaluates the observed FAB as defective, the drive control part 173 cancels the first bonding and retracts the bonding tool 120 to suspend the series of bonding steps.

A second adequacy evaluation evaluates a fixing picture, which is a picture of the bonding point after the wire 310 is fixed. Specifically, the pad joint end picture 312' and the lead joint end picture 313' are evaluated. For example, by extracting respective contours of the pad joint end picture 312' and the pad electrode picture 321', it is evaluated whether the pad joint end protrudes from the pad electrode 321, and further, whether the pad joint end does not deviate from a center position. Similarly, by extracting respective contours of the lead joint end picture 313' and the lead electrode picture 322', it is evaluated whether the lead joint end protrudes from the lead electrode 322, and further, whether the lead joint end does not deviate from a center position. In the case where the evaluation part 174 evaluates the respective joint ends as good, the drive control part 173 performs the bonding process directly. On the other hand, in the case where the evaluation part 174 evaluates at least one of the joint ends as defective, the drive control part 173 retracts the bonding tool 120 to suspend the series of bonding steps.

Although two adequacy evaluations have been described herein, the evaluation part 174 may also perform other adequacy evaluations using these images. The image acquisition part 171 transmits imaging signals to the first imaging unit 130 and the second imaging unit 140 at a timing corresponding to the item of adequacy evaluation performed by the evaluation part 174, and acquires the first image and the second image.

Figure 7:
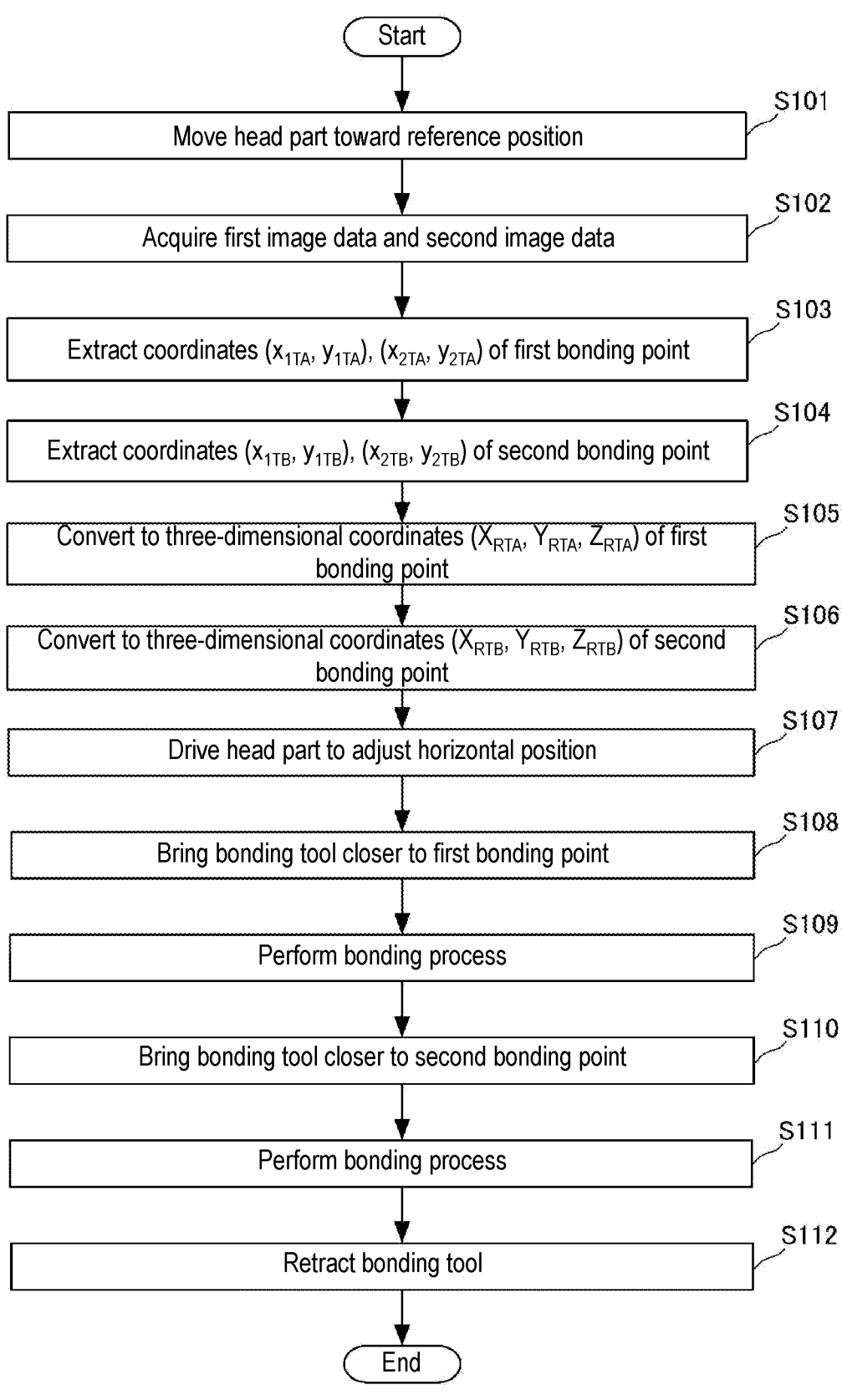
FIG. 7 is a flowchart illustrating a processing procedure of an arithmetic processing part.

Next, a series of bonding processes performed by the wire bonder 100 will be described. FIG. 7 is a flowchart illustrating a processing procedure of the arithmetic processing part 170. Herein, only a processing procedure of connecting a set of the pad electrode 321 and the lead electrode 322 will be described, and the adequacy evaluation described with reference to FIG. 6 will be omitted.

In step S101, the drive control part 173 transmits, to the head drive motor 150, a drive signal for moving the head part 110 to a reference position. The head drive motor 150 receives the drive signal and moves the head part 110 to the reference position. Herein, the reference position is a position assumed for the bonding tool 120 to be positioned in the vicinity directly above the electrode 321 which is the first bonding point. If the head part 110 is positioned at the reference position, the first imaging unit 130 and the second imaging unit 140 can image the lead electrode 322, which is the second bonding point, together with the electrode 321 in one image in a focused state.

After the head part 110 reaches the reference position, in step S102, the image acquisition part 171 transmits imaging request signals to the first imaging unit 130 and the second imaging unit 140, and acquires first image data and second image data. The image acquisition part 171 delivers the acquired image data to the calculation part.

In step S103, the calculation part 172 finds a target pad electrode picture 321' from the first image of the first image data received from the image acquisition part 171, and extracts coordinates $(x_{1TA}, y_{1TA})$ of the first bonding point. Similarly, a target pad electrode picture 321' is found from the second image of the second image data received from the image acquisition part 171, and coordinates $(x_{2TA}, y_{2TA})$ of the first bonding point are extracted. Subsequently, in step S104, the calculation part 172 finds a target lead electrode picture 322' from the first image and extracts coordinates $(x_{1TB}, y_{1TB})$ of the second bonding point. Similarly, a target lead electrode picture 322' is found from the second image, and coordinates $(x_{2TB}, y_{2TB})$ of the second bonding point are extracted.

Proceeding to step S105, the calculation part 172 refers to the conversion table 181 and obtains three-dimensional coordinates $(X_{RTA}, Y_{RTA}, Z_{RTA})$ corresponding to the pair of $(x_{1TA}, y_{1TA})$ and $(x_{2TA}, y_{2TA})$ as the three-dimensional coordinates of the target point (first bonding point). Subsequently, in step S106, the calculation part 172 similarly refers to the conversion table 181 to obtain three-dimensional coordinates $(X_{RTB}, Y_{RTB}, Z_{RTB})$ corresponding to the pair of $(x_{1TB}, y_{1TB})$ and $(x_{2TB}, y_{2TB})$ as the three-dimensional coordinates of the subsequent point. The process of step S105 may also be performed following the process of step S103, and the process of step S106 may also be performed following the process of step S104.

In step S107, the drive control part 173 determines the three-dimensional coordinates $(X_{RTA}, Y_{RTA}, Z_{RTA})$ of the target point as an approach target, and transmits a drive signal to the head drive motor 150 to adjust an error in the horizontal position. Accordingly, the center of the bonding tool 120 is arranged at $(X_{RTA}, Y_{RTA})$ in the horizontal plane. Next, in step S108, based on the calculated $Z=Z_{RTA}$, the drive control part 173 brings the bonding tool 120 closer to the target point until the FAB contacts the pad electrode 321. Herein, since the amount of lowering of the bonding tool 120 is accurately learned from the calculated $Z_{RTA}$, the drive control part 173 may lower the bonding tool 120 at high speed until immediately before the FAB contacts the pad electrode 321.

After the bonding tool 120 is lowered to a position at which the FAB contacts the pad electrode 321, proceeding to step S109, the arithmetic processing part 170 performs a bonding process. Specifically, the clamper is loosened and the tip of the capillary is pressed against the FAB to perform heating and vibration.

After the process of the first bonding is completed, proceeding to step S110, the drive control part 173 displaces the bonding tool 120 such that the wire 310 fed from the capillary draws a loop, and the drive control part 173 brings the bonding tool 120 closer to the subsequent point (second bonding point) until the wire 310 at the tip of the capillary contacts the lead electrode 322. At this time, the drive control part 173 raises and lowers the bonding tool 120 to perform position adjustment in the height direction, and horizontally moves at least one of the head part 110 and the stage 220 to perform position adjustment in the horizontal direction.

After the wire 310 at the tip of the capillary contacts the lead electrode 322, proceeding to step S11/, the arithmetic processing part 170 performs a bonding process. Specifically, the tip of the capillary is pressed against the wire 310 to perform heating and vibration. After the bonding process is completed, proceeding to step S112, the arithmetic processing part 170 brings the clamper into a clamping state, and the drive control part 173 retracts the bonding tool 120 upward. Accordingly, the wire 310 is cut at the lead joint end, and one wire connection process is completed.

Although the wire bonder 100 has been described above as an example of the bonding apparatus, the bonding apparatus to which the method and configuration for calculating three-dimensional coordinates according to this embodiment may be applied is not limited to the example of the wire bonder 100 which connects two bonding points with a wire. For example, it may also be applied to a bump bonder that forms bumps on each of a plurality of electrodes on a substrate. In the case of a bump bonder, three-dimensional coordinates may be calculated by taking each electrode as a bonding point, and a bonding tool for forming bumps may be driven and controlled based on the three-dimensional coordinates. Further, for a plurality of electrodes captured in both images obtained in one imaging process, an electrode at which a bump is about to be formed may be taken as a target point and an electrode at which a bump is to be formed next may be taken as a subsequent point to calculate three-dimensional coordinates collectively.

REFERENCE SIGNS LIST

100 . . . Wire bonder; 110 . . . Head part; 120 . . . Bonding tool; 130 . . . First imaging unit; 131 . . . First optical system; 131*a* . . . Object-side lens group; 131*b* . . . Image-side lens group; 132 . . . First imaging element; 133 . . . Diaphragm; 140 . . . Second imaging unit; 141 . . . Second optical system; 142 . . . Second imaging element; 150 . . . Head drive motor; 160 . . . Tool drive motor; 170 . . . Arithmetic processing part; 171 . . . Image acquisition part; 172 . . . Calculation part; 173 . . . Drive control part; 180 . . . Storage part; 181 . . . Conversion table; 190 . . . Input/output device; 210 . . . Pedestal; 220 . . . Stage; 310 . . . Wire; 311' . . . FAB picture; 312' . . . Pad joint end picture; 313' . . . Lead joint end picture; 320 . . . Semiconductor chip; 321 . . . Pad electrode; 321' . . . Pad electrode picture; 322 . . . Lead electrode; 322' . . . Lead electrode picture; 330 . . . Substrate; 400 . . . Chart; 400' . . . Chart picture; 410 . . . Dot; 410' . . . Dot picture

What is claimed is:

1. A bonding apparatus comprising:

a head part provided in a drivable manner with respect to a substrate mounted on a stage;

a bonding tool which is provided at the head part and supplies a bonding wire to bonding points of the substrate;

a first imaging unit and a second imaging unit provided at the head part, each of the first imaging unit and the second imaging unit comprising an optical system and an imaging element arranged to satisfy a Scheimpflug condition such that a plane parallel to a stage surface of the stage becomes a focal plane, the first imaging unit and the second imaging unit being capable of focusing a tip of the bonding wire extended from the bonding tool, and being configured to simultaneously capture a first image and a second image;

a calculation part which calculates three-dimensional coordinates of a target point to which the bonding wire is to be supplied next among the bonding points, based on a first picture which is a picture of the target point captured in the first image outputted by the first imaging unit, and a second picture which is a picture of the target point captured in the second image outputted by the second imaging unit; and a drive control part which causes the bonding tool to approach the target point based on the three-dimensional coordinates of the target point calculated by the calculation part, wherein the calculation part calculates three-dimensional coordinates of a subsequent point to which the bonding wire is to be supplied subsequently among the bonding points, based on a third picture which is a picture of the subsequent point captured in the first image, and a fourth picture which is a picture of the subsequent point captured in the second image, and after supply of the bonding wire to the target point, the drive control part moves the bonding tool based on the three-dimensional coordinates of the subsequent point calculated by the calculation part.

2. The bonding apparatus according to claim 1, comprising an evaluation part which evaluates adequacy of a bonding process based on an image outputted by at least one of the first imaging unit and the second imaging unit, wherein the drive control part changes drive control of the bonding tool based on an evaluation result of the evaluation part.

3. The bonding apparatus according to claim 2, wherein the evaluation part evaluates a tip picture which is a picture of the tip of the bonding wire before contacting the bonding points.

4. The bonding apparatus according to claim 2, wherein the evaluation part evaluates a fixing picture which is a picture of the bonding points after fixing the bonding wire.

5. A bonding method using a bonding apparatus comprising:

a head part provided in a drivable manner with respect to a substrate mounted on a stage;

a bonding tool which is provided at the head part and supplies a bonding wire to bonding points of the substrate; and a first imaging unit and a second imaging unit provided at the head part, each of the first imaging unit and the second imaging unit comprising an optical system and an imaging element arranged to satisfy a Scheimpflug condition such that a plane parallel to a stage surface of the stage becomes a focal plane, the first imaging unit and the second imaging unit being capable of focusing a tip of the bonding wire extended from the bonding tool, and being configured to simultaneously capture a first image and a second image, the bonding method comprising:

an imaging step of causing each of the first imaging unit and the second imaging unit to simultaneously image a target point to which the bonding wire is to be supplied next among the bonding points of the substrate fixed on the stage;

a calculation step of calculating three-dimensional coordinates of the target point based on a first picture which is a picture of the target point captured in the first image outputted by the first imaging unit, and a second picture which is a picture of the target point captured in the second image outputted by the second imaging unit, and calculating three-dimensional coordinates of a subsequent point to which the bonding wire is to be supplied subsequently among the bonding points, based on a third picture which is a picture of the subsequent point captured in the first image, and a fourth picture which is a picture of the subsequent point captured in the second image; and a driving step of causing the bonding tool which supplies the bonding wire to approach the target point based on the three-dimensional coordinates of the target point, and moving, after supply of the bonding wire to the target point, the bonding tool based on the three-dimensional coordinates of the subsequent point.

6. A computer readable storage medium storing a bonding program which controls a bonding apparatus comprising:

a head part provided in a drivable manner with respect to a substrate mounted on a stage;

a bonding tool which is provided at the head part and supplies a bonding wire to bonding points of the substrate; and a first imaging unit and a second imaging unit provided at the head part, each of the first imaging unit and the second imaging unit comprising an optical system and an imaging element arranged to satisfy a Scheimpflug condition such that a plane parallel to a stage surface of the stage becomes a focal plane, the first imaging unit and the second imaging unit being capable of focusing a tip of the bonding wire extended from the bonding tool, and being configured to simultaneously capture a first image and a second image, the bonding program causing a computer to execute:

an imaging step of causing each of the first imaging unit and the second imaging unit to image a target point to which the bonding wire is to be supplied next among the bonding points of the substrate fixed on the stage;

a calculation step of calculating three-dimensional coordinates of the target point based on a first picture which is a picture of the target point captured in the first image outputted by the first imaging unit, and a second picture which is a picture of the target point captured in the second image outputted by the second imaging unit, and calculating three-dimensional coordinates of a subsequent point to which the bonding wire is to be supplied subsequently among the bonding points, based on a third picture which is a picture of the subsequent point captured in the first image, and a fourth picture which is a picture of the subsequent point captured in the second image; and a driving step of causing the bonding tool which supplies the bonding wire to approach the target point based on the three-dimensional coordinates of the target point, and moving, after supply of the bonding wire to the target point, the bonding tool based on the three-dimensional coordinates of the subsequent point.

\* \* \* \* \*